US012575382B2

(12) United States Patent
Sanghvi et al.

(10) Patent No.: US 12,575,382 B2
(45) Date of Patent: Mar. 10, 2026

(54) METHODS AND MECHANISMS FOR ADJUSTING CHUCKING VOLTAGE DURING SUBSTRATE MANUFACTURING

(71) Applicant: Applied Materials, Inc., Santa Clara, CA (US)

(72) Inventors: Mitesh Sanghvi, Dublin, CA (US); Venkatanarayana Shankarmurthy, San Jose, CA (US); Abdul Aziz Khaja, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 746 days.

(21) Appl. No.: 17/875,678

(22) Filed: Jul. 28, 2022

(65) Prior Publication Data

US 2024/0038601 A1 Feb. 1, 2024

(51) Int. Cl.
*H01L 21/66* (2006.01)
*H01L 21/683* (2006.01)

(52) U.S. Cl.
CPC .......... *H01L 22/26* (2013.01); *H01L 21/6833* (2013.01); *H01L 22/14* (2013.01)

(58) Field of Classification Search
CPC ..... H01L 22/26; H01L 21/6833; H01L 22/14; H01L 21/67253; H01L 21/67288; G05B 19/18; H02N 13/00
See application file for complete search history.

(56) References Cited

U.S. PATENT DOCUMENTS 6,430,022 B2 * 8/2002 Leeser ................ H01L 21/6833
361/234
2009/0053836 A1 2/2009 Pipitone et al.

| | | | |
|---|---|---|---|
| 2014/0167613 A1 | 6/2014 | Fong et al. | |
| 2019/0378697 A1 | 12/2019 | Lee et al. | |
| 2020/0249263 A1 * | 8/2020 | Xu | ........................ H01L 21/6833 |
| 2020/0286716 A1 * | 9/2020 | Kumar | ................. C23C 16/4583 |
| 2021/0159107 A1 * | 5/2021 | Woo | ........................ C23C 16/505 |
| 2021/0351060 A1 * | 11/2021 | Ulavi | ................. H01L 21/67253 |
| 2022/0199374 A1 | 6/2022 | Oh et al. | |

FOREIGN PATENT DOCUMENTS

| | | |
|---|---|---|
| JP | 2022032996 A | 2/2022 |
| WO | 2011118159 A1 | 9/2011 |

OTHER PUBLICATIONS

International Search Report and Written Opinion for International Application No. PCT/US2023/028507, mailed Nov. 13, 2023, 15 Pages.

* cited by examiner

*Primary Examiner* — Lee E Rodak
(74) *Attorney, Agent, or Firm* — Lowenstein Sandler LLP

(57) ABSTRACT

An electronic device manufacturing system including a substrate-holder configured to secure a substrate during processing and a controller, operatively coupled to the substrate-holder. The controller is configured to apply, to an electrode of the substrate-holder, a first voltage. The controller is further configured to determine a first impedance value between the substrate-holder and the substrate. The controller is further configured to determine a delta value between the first impedance value and a predetermined second impedance value, and determine whether the delta value satisfies a threshold criterion. Responsive to the delta value failing to satisfy the threshold criterion, the controller is further configured to apply a second voltage to the substrate, wherein the second voltage is greater than the first voltage.

14 Claims, 6 Drawing Sheets

300

400

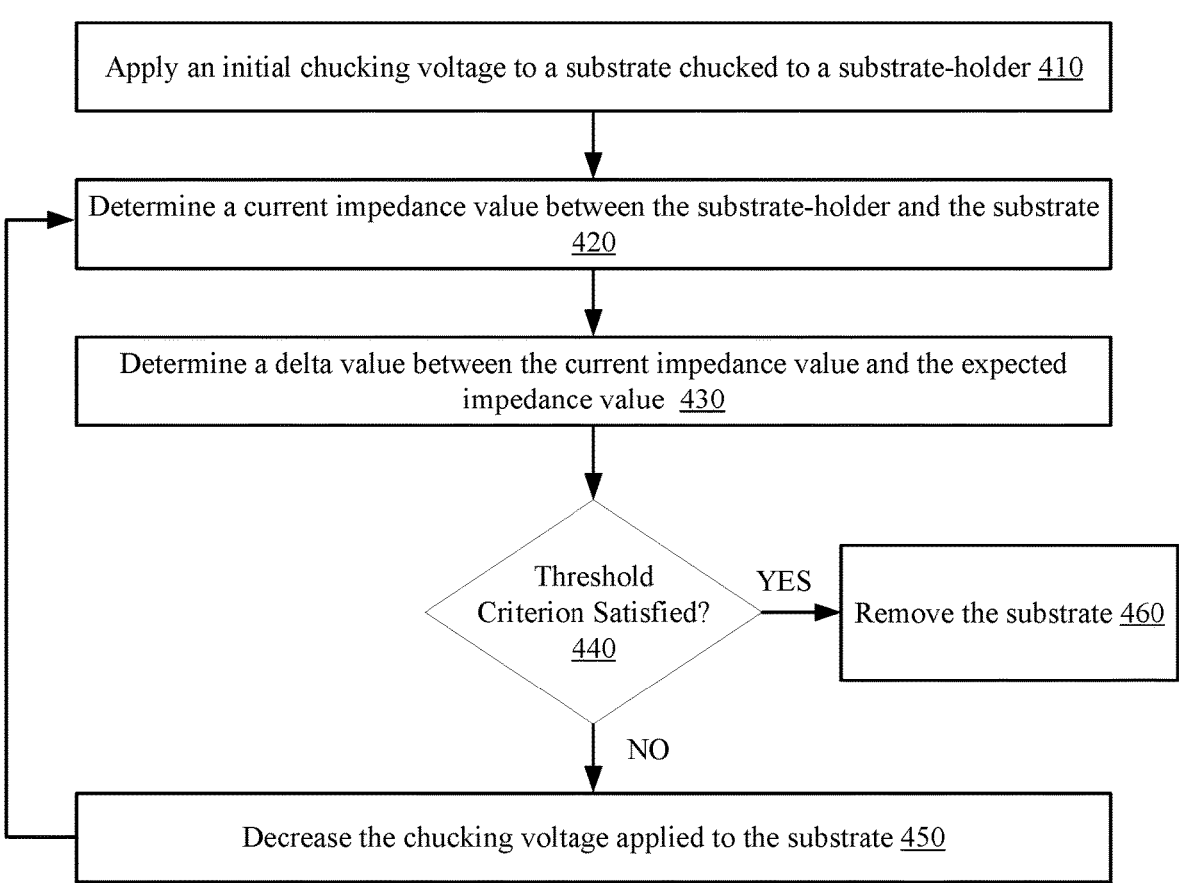

Apply an initial chucking voltage to a substrate chucked to a substrate-holder 410

Determine a current impedance value between the substrate-holder and the substrate 420

Determine a delta value between the current impedance value and the expected impedance value 430

Threshold Criterion Satisfied? 440

YES → Remove the substrate 460

NO

Decrease the chucking voltage applied to the substrate 450

FIG. 4

METHODS AND MECHANISMS FOR ADJUSTING CHUCKING VOLTAGE DURING SUBSTRATE MANUFACTURING

TECHNICAL FIELD

The present disclosure relates to electrostatic chucks, and, more particularly, to methods and mechanisms adjusting chucking voltage during substrate manufacturing.

BACKGROUND

In semiconductor processing chambers that use high power plasma processes, there is a risk of damage of certain chamber hardware if the hardware comes in contact with the plasma in an unintended way. A substrate-holder (also referred to as a "chuck") that holds a substrate can have heaters to raise the temperature of the substrate as specified by a particular process recipe. This heater or substrate-holder also offers electrical ground to the plasma used in a deposition or etch reactor. For intended process control and to prevent damage to hardware and/or a substrate, the substrate should be placed centrally in an x-y plane (i.e. the center of the wafer is properly aligned with the chuck), and/or when there is proper contact established between the chuck and the substrate in the z-direction. In case of an electrostatic chuck (ESC), an electrostatic holding force can be applied to the substrate to keep the substrate in position. However, the substrate can have some 'bow' that prevents proper contact with the chuck and the heater. This not only potentially exposes the heater to the high power plasma, causing damage of the heater/faceplate, but also can result in undesirable coating on the backside of the substrate, which can result in the substrate being discarded altogether.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system includes a substrate-holder configured to secure a substrate during processing and a controller, operatively coupled to the substrate-holder. The controller is configured to apply, to an electrode of the substrate-holder, a first voltage. The controller is further configured to determine a first impedance value between the substrate-holder and the substrate. The controller is further configured to determine a delta value between the first impedance value and a predetermined second impedance value, and determine whether the delta value satisfies a threshold criterion. Responsive to the delta value failing to satisfy the threshold criterion, the controller is further configured to apply a second voltage to the substrate, wherein the second voltage is greater than the first voltage.

A further aspect of the disclosure includes a method according to any aspect or embodiment described herein.

A further aspect of the disclosure includes a non-transitory computer-readable storage medium comprising instructions that, when executed by a processing device operatively coupled to a memory, performs operations according to any aspect or embodiment described herein.

BRIEF DESCRIPTION OF THE DRAWINGS

The present disclosure is illustrated by way of example, and not by way of limitation in the figures of the accompanying drawings.

FIG. 4 is a flow chart of a method for performing a de-chucking sequence on a substrate, according to certain embodiments.

DETAILED DESCRIPTION

Figure 1:
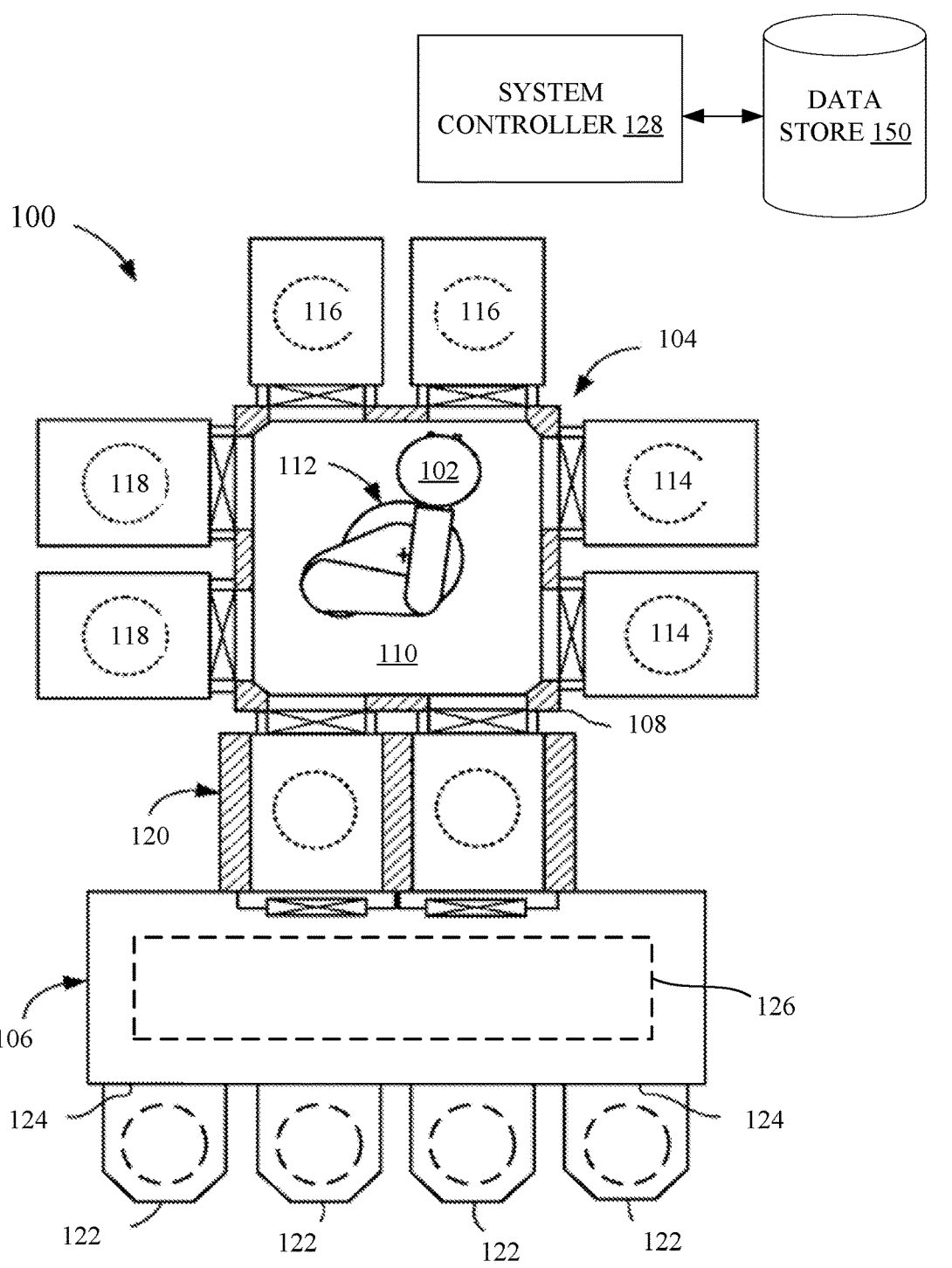
FIG. 1 is a top schematic view of an example manufacturing system, according to certain embodiments.

Described herein are technologies directed to methods and mechanisms for adjusting chucking voltage during substrate manufacturing. An electronic device manufacturing system can be configured to perform one or more manufacturing processes (e.g., deposition process, etch process, polishing process, etc.) upon a substrate in one or more process chambers. For example, during a deposition process (e.g., a deposition (CVD) process, an atomic layer deposition (ALD) process, and so forth), a film can be deposited on the surface of a substrate. The manufacturing system can use one or more robots to position the substrate onto a substrate-holder (e.g. a "chuck") inside the process chamber. Substrate-holders can have heaters to raise the temperature of the substrate as specified by a particular process recipe that defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc. Some substrate-holders, such as electrostatic chucks (ESC), can include a platen with electrodes biased with a DC voltage to establish an electrostatic holding force to keep the substrate in place with respect to the substrate-holder.

In certain instances, the layers formed by the deposition process or a former deposition process can cause the substrate to experience a 'bow' (a deviation of the center point of the median surface of a substrate from a reference plane) that prevents proper contact with the substrate-holder and the heater. For example, the layers formed by the deposition process can exert a force on the edges of the substrate greater than the electrostatic force used to keep the substrate in place, causing the edges of the substrate to rise or warp. This not only exposes the surface of the chuck to the high power plasma, causing damage of the chuck, but also can result in an undesirable coating on a backside of the substrate.

In other instances, once the application of the chucking voltage is ceased, the residual electro-static force can take a certain amount of time to dissipate. This dissipation time can vary based on different factors, such as an intensity of the chucking voltage, a number and/or thicknesses of deposited layers, etc. Removing, via a robot, the substrate prior to the dissipation of the electro-static force can cause excess force to be applied to the substrate, resulting in damage to the substrate, damage to the chuck, etc.

Aspects and implementations of the present disclosure address these and other shortcomings of the existing technology by adjusting a chucking voltage before, during and/or after substrate manufacturing. Such substrate manufacturing can include deposition processes, etch processes, and so on. In one embodiment, once a substrate is positioned on a substrate-holder, the substrate-holder can apply an initial chucking voltage (e.g., 400 volts (V)) to the substrate. The initial chucking voltage can be set during calibration of the manufacturing system and be based on a minimum or average chucking voltage sufficient to chuck a substrate (e.g., a flat substrate or a substrate with an average or minimal amount of bowing). The manufacturing system can then measure an impedance value between the substrate holder and the substrate. For example, the manufacturing system can, using a set of electrical sensors coupled to the substrate-holder, take a set of impedance readings and determine an average impedance value. The manufacturing system can compare this current impedance value to an expected impedance value to determine a delta value (i.e., a difference between the current impedance value and the expected impedance value, optionally expressed as |current impedance value–expected impedance value|). The expected impedance value can be an impedance value indicative of a chucked substrate experiencing no bow (or an acceptable minimum bow). The manufacturing system can determine whether the delta value satisfies a chuck threshold criterion (e.g., whether the delta value is below an allowable limit). Responsive to the delta value being greater than the allowable limit, the manufacturing system can increase the chucking voltage by an incremental value (e.g., 10V). The manufacturing system can then determine a new impedance value, determine a new delta value, and determine whether the new delta value satisfies the chuck threshold criterion. The manufacturing system can perform this loop until a delta value satisfies the chuck threshold criterion.

In one embodiment, once the delta value is less than the allowable threshold value (indicating that the substrate is chucked with no bow), the process chamber initiates a manufacturing process. During the manufacturing process, the manufacturing system can take periodic impedance readings and, responsive to determining that bowing has occurred (e.g., a delta value has become greater than the allowable threshold value), the manufacturing system can increase the chucking voltage to remove the bow.

Once the manufacturing process is complete, the manufacturing system can perform de-chucking operations to de-chuck the substrate. In particular, the manufacturing system can incrementally decrease the chucking voltage while measuring the impedance between the substrate and the substrate holder to determine the delta value. Once the delta value is greater than a de-chuck threshold value (indicating that the electro-static force is dissipated or not strong enough to cause damage to the substrate during its removal), then the manufacturing system, via a transfer chamber robot, can remove the substrate from the substrate-holder.

Aspects of the present disclosure result in technological advantages of significant reduction in time taken to chuck and de-chuck a substrate. Aspects of the present disclosure further result in technological advantages of preventing substrate bowing during a manufacturing process, thus preventing damage of the heater and/or faceplate of the substrate-holder, and preventing an undesirable coating on the backside of the substrate. Aspects of the present disclosure further result in technological advantages of preventing damage to the substrate or to the heater due to removal of a substrate chucked due to residual electrostatic forces. Thus present disclosure can prevent damaged or abnormal products, and unscheduled user time or down time for repairs in embodiments.

FIG. 1 is a top schematic view of an example manufacturing system 100, according to aspects of the present disclosure. Manufacturing system 100 can perform one or more processes to produce products, such as electronic devices, following a recipe or performing runs over a time period. Examples of substrate processes include a deposition process to deposit one or more layers of film on a surface of the substrate, an etch process to form a pattern on the surface of the substrate, etc. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon. Manufacturing equipment 100 can perform each process according to a process recipe. A process recipe defines a particular set of operations to be performed for the substrate 102 during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

Manufacturing system 100 can include a process tool 104 and a factory interface 106 coupled to process tool 104. Process tool 104 can include a housing 108 having a transfer chamber 110 therein. Transfer chamber 110 can include one or more process chambers (also referred to as processing chambers) 114, 116, 118 disposed therearound and coupled thereto. Process chambers 114, 116, 118 can be coupled to transfer chamber 110 through respective ports, such as slit valves or the like. Transfer chamber 110 can also include a transfer chamber robot 112 configured to transfer substrate 102 between process chambers 114, 116, 118, load lock 120, etc. Transfer chamber robot 112 can include one or multiple arms where each arm includes one or more end effectors at the end of each arm. The end effector can be configured to handle particular objects, such as wafers, sensor discs, sensor tools, etc.

Process chambers 114, 116, 118 can be adapted to carry out any number of processes on substrates 102. A same or different substrate process can take place in each processing chamber 114, 116, 118. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 114, 116, 118 can each include one or more sensors configured to capture data for substrate 102 before, after, or during a substrate process. For example, the one or more sensors can be configured to capture spectral data and/or non-spectral data for a portion of substrate 102 during a substrate process. In other or similar embodiments, the one or more sensors can be configured to capture data associated with the environment within process chamber 114, 116, 118 before, after, or during the substrate process. For example, the one or more sensors can be configured to capture data associated with a temperature, a pressure, a gas concentration, etc. of the environment within process chamber 114, 116, 118 during the substrate process.

A load lock 120 can also be coupled to housing 108 and transfer chamber 110. Load lock 120 can be configured to interface with, and be coupled to, transfer chamber 110 on one side and factory interface 106. Load lock 120 can have an environmentally-controlled atmosphere that can be changed from a vacuum environment (wherein substrates can be transferred to and from transfer chamber 110) to an at or near atmospheric-pressure inert-gas environment (wherein substrates can be transferred to and from factory interface 106) in some embodiments. Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between carriers (also referred to as containers) 122 and load lock 120. Carriers 122 can be a substrate storage carrier or a replacement part storage carrier.

Manufacturing system 100 can also be connected to a client device (not shown) that is configured to provide information regarding manufacturing system 100 to a user (e.g., an operator). The client device can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the client device can provide information to a user of manufacturing system 100 via one or more graphical user interfaces (GUIs). For example, the client device can provide information regarding a chucking or dechucking status via a GUI, in accordance with embodiments described herein.

Manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. In some embodiments, system controller 128 can execute instructions to perform one or more operations at manufacturing system 100 in accordance with a process recipe. The instructions can be stored on a computer readable storage medium, which can include the main memory, static memory, secondary storage and/or processing device (during execution of the instructions).

System controller 128 can receive data from sensors included on or within various portions of manufacturing system 100 (e.g., processing chambers 114, 116, 118, transfer chamber 110, load lock 120, etc.). In some embodiments, data received by the system controller 128 can include spectral data and/or non-spectral data for a portion of substrate 102. In other or similar embodiments, data received by the system controller 128 can include data associated with processing substrate 102 at processing chamber 114, 116, 118, as described previously. For purposes of the present description, system controller 128 is described as receiving data from sensors included within process chambers 114, 116, 118. However, system controller 128 can receive data from any portion of manufacturing system 100 and can use data received from the portion in accordance with embodiments described herein. In an illustrative example, system controller 128 can receive data from one or more sensors for process chamber 114, 116, 118 before, after, or during a substrate process at the process chamber 114, 116, 118. Data received from sensors of the various portions of manufacturing system 100 can be stored in a data store 150. Data store 150 can be included as a component within system controller 128 or can be a separate component from system controller 128.

Data store 150 can be a memory (e.g., random access memory), a drive (e.g., a hard drive, a flash drive), a database system, or another type of component or device capable of storing data. Data store 150 can include multiple storage components (e.g., multiple drives or multiple databases) that can span multiple computing devices (e.g., multiple server computers). The data store 150 can store data associated with processing a substrate at manufacturing equipment 100. For example, data store 150 can store data collected by sensors at manufacturing equipment before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store 150 can also store spectral data or non-spectral data associated with a portion of a substrate processed at manufacturing equipment 100. Spectral data can include historical spectral data and/or current spectral data.

The data store 150 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

The data store 150 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some embodiments, data store 150 can store chucking profiles. A chucking profile can include a chucking voltage for different steps of a process recipe. For example, for a particular deposition recipe, the chucking profile can include a first chucking voltage (450V) for the first twenty deposition layers or first layer thickness range, a second chucking voltage (470V) for the next twenty deposition layers or second layer thickness range, a third chucking voltage (e.g., 500V) for the next thirty layers or third layer thickness range, and so forth. Each chucking profile can be generated using user input, or during a manufacturing process. For example, during a deposition process using a particular recipe, the manufacturing system can perform a chucking sequence (as discussed in FIG. 3) and determine which steps of the process recipe are to experience increases in chucking voltages. The chucking profile can be generated based on these increases, and during a subsequent deposition process using the particular deposition recipe, the manufacturing system can increase the chucking voltage during specific process steps as indicated by the chucking profile.

In some embodiments, data store 150 can store de-chucking profiles. A de-chucking profile can include a chucking voltage for safe removal of the substrate from the substrate holder. For example, for a particular deposition recipe, the de-chucking profile can include a chucking voltage reflecting an electro-static force not strong enough to cause damage to the substrate during its removal (hereafter "removal chucking voltage"). Each de-chucking profile can be generated using user input, or during a manufacturing process. For example, during a deposition process using a particular recipe, the manufacturing system can perform a de-chucking sequence (as discussed in FIG. 4) and determine a removal chucking voltage (a voltage low enough to facilitate safe substrate removal). During a subsequent deposition process using the particular deposition recipe, the manufacturing system can decrease the chucking voltage to the removal chucking voltage as indicated by the de-chucking profile.

Figure 2:
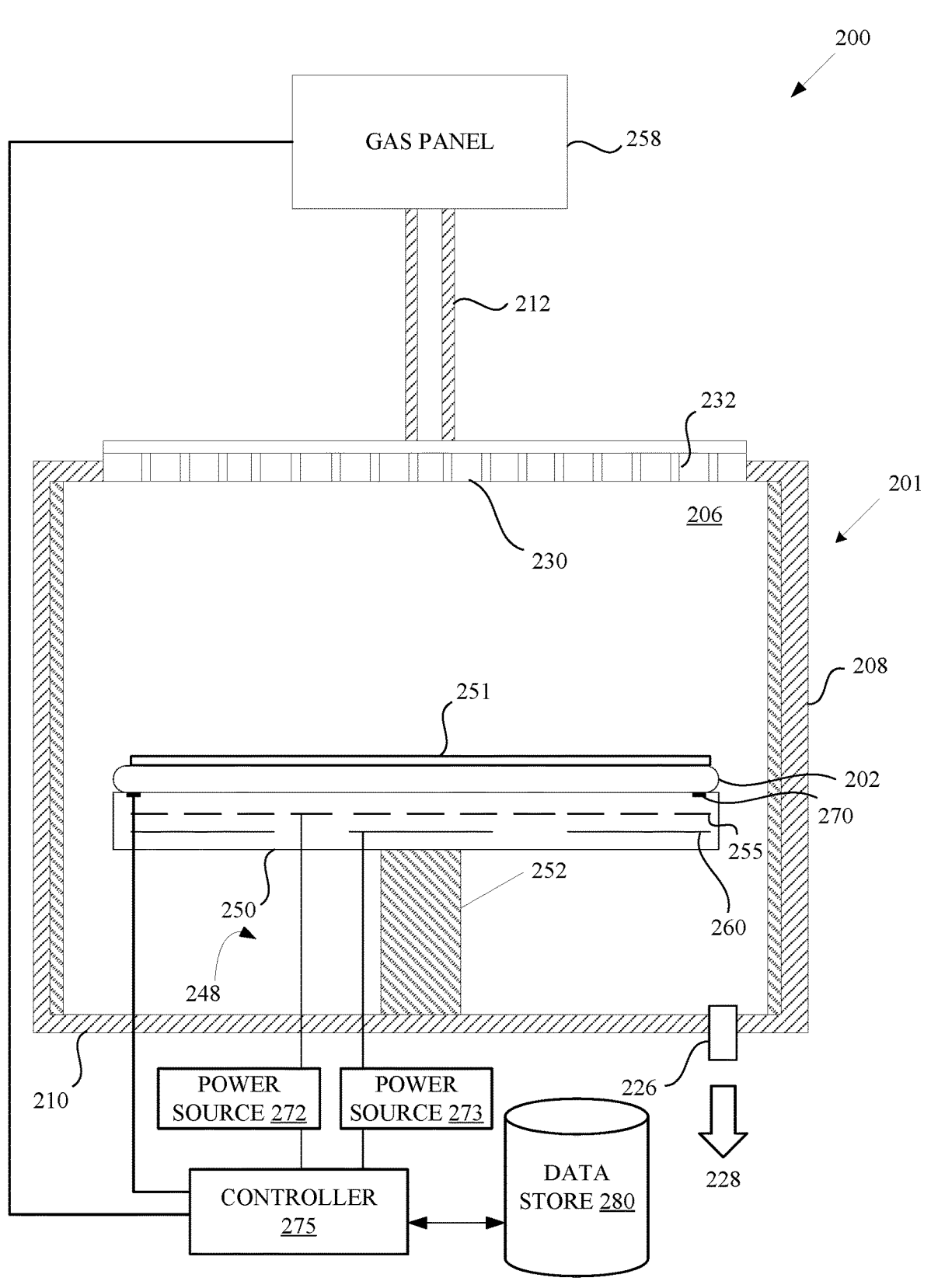
FIG. 2 is a cross-sectional schematic side view of an example process chamber of the example manufacturing system, according to certain embodiments.

In some embodiments, data store 150 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 150 can be inaccessible by the user of the manufacturing system. In other or similar embodiments, a portion of data stored at data store 150 can be inaccessible by the user while another portion of data stored at data store 150 can be accessible by the user. In some embodiments, one or more portions of data stored at data store 150 can be encrypted using an encryption mechanism that is unknown to the user (e.g., data is encrypted using a private encryption key). In other or similar embodiments, data store 150 can include multiple data stores where data that is inaccessible to the user is stored in one or more first data stores and data that is accessible to the user is stored in one or more second data stores FIG. 2 is a cross-sectional schematic side view of a process chamber 200, in accordance with embodiments of the present disclosure. In some embodiments, process chamber 200 can correspond to process chamber 114, 116, 118, described with respect to FIG. 1. Process chamber 200 can be used for processes in which a corrosive plasma environment is provided. For example, the process chamber 200 can be a chamber for a plasma etcher or plasma etch reactor, and so forth. In another example, process chamber can be a chamber for a deposition process, as previously described. In one embodiment, the process chamber 200 includes a chamber body 201 and a showerhead 230 that encloses an interior volume 206. The showerhead 230 can include a showerhead base and a showerhead gas distribution plate. Alternatively, the showerhead 230 can be replaced by a lid and a nozzle in some embodiments, or by multiple pie shaped showerhead compartments and plasma generation units in other embodiments. The chamber body 201 can be fabricated from aluminum, stainless steel or other suitable material such as titanium (Ti). The chamber body 201 generally includes sidewalls 208 and a bottom 210. An exhaust port 226 can be defined in the chamber body 201, and can couple the interior volume 206 to a pump system 228. The pump system 228 can include one or more pumps and throttle valves utilized to evacuate and regulate the pressure of the interior volume 206 of the process chamber 200.

The showerhead 230 can be supported on the sidewall 208 of the chamber body 201. The showerhead 220 (or lid) can be opened to allow access to the interior volume 206 of the process chamber 200, and can provide a seal for the process chamber 200 while closed. A gas panel 258 can be coupled to the process chamber 200 to provide process and/or cleaning gases to the interior volume 206 through the showerhead 230 or lid and nozzle (e.g., through apertures of the showerhead or lid and nozzle). For example gas panel 258 can provide precursors for materials of a film 251 deposited on a surface of a substrate 202. In some embodiments, a precursor can include a silicon-based precursor or a boron-based precursor. The showerhead 230 can include a gas distribution plate (GDP) and can have multiple gas delivery holes 232 (also referred to as channels) throughout the GDP.

A substrate support assembly 248 is disposed in the interior volume 206 of the process chamber 200 below the showerhead 230. The substrate support assembly 248 holds a substrate 202 during processing (e.g., during a deposition process) using, for example, substrate-holder 250.

The substrate-holder 250 can comprise an electrostatic chuck (ESC), though the scope of the disclosure is not limited to an ESC. The ESC can be or include a platen with electrodes 255 that may be biased with a voltage (e.g., a direct current ("DC") voltage) to establish electrostatic holding force to keep a substrate 202 in place with respect to the substrate-holder 250.

A power source 272 (e.g., a DC power source) can be coupled to the electrodes 255 of the substrate-holder 150 to create an electrostatic force that holds down the substrate 202. The power source 272 can be a monopolar source or a bipolar source in embodiments. A controller 275 can be coupled to the electrodes 255 (or to the power source 272 that couples to the electrodes 255). In embodiments, the controller 275 corresponds to system controller 128 of FIG. 1. Controller 275 can adjust the power supplied by the power source 272 that powers the electrodes 255 to adjust the electrostatic chucking force.

In embodiments, substrate-holder 250 includes one or more heating elements 260, which can heat one or more zones of the substrate-holder 250, and of substrate 202. A power source 273 may connect to the heating elements 273, and can provide power to the heating elements 260 to heat the substrate 202 to a target temperature before, during and/or after processing. Controller 275 can connect to power source 273 to control power source 273. Different layers on the substrate 202 can have different coefficients of thermal expansion. As the substrate 202 is heated, these different coefficients of thermal expansion can cause the substrate 202 to bow.

Ideally, there should not be any gap between the substrate 202 and a surface of the substrate-holder 250. However, due to improper chucking and/or excessive substrate bow, there can be an undesirable finite gap between the substrate 202 and a surface of the substrate-holder 250. Because of this gap, arcing can happen between the substrate 202 and the substrate-holder 250 when high power radio-frequency plasma is on, and the arcing can damage exposed portions of the substrate-holder 250 (including a heater and a faceplate) as well as the substrate 202 itself. Also, an undesired coating can adhere to the backside of the substrate 202 as plasma reaches the gap.

The substrate-holder 250 can include one or more electrical sensors 270 to measure one or more electrical properties (e.g., impedance, magnetic fluctuations in the electrical feed conductor, electrical current, voltage, resistance, etc.) between the substrate 202 and the substrate-holder 250. The electrical sensors 270 can also measure values of one or more of electrical current, magnitude of Alternating Current (AC), phase, waveform (e.g., alternating current (AC) waveform, pulse waveform), Direct Current (DC), non-sinusoidal AC waveforms, voltage, or the like. In some embodiments, the electrical sensors 270 can be embedded in the substrate-holder (e.g., contactless sensors). In some embodiments, the electrical sensors 270 can be positioned on the surface of the substrate-holder and exposed to the surface. In some embodiments, the electrical sensors 270 can be one or more of piezoelectric sensors, charge output sensors, charge coupled devices (CCDs), capacitive type sensor and resistive type sensor, or any other type of electrical sensor capable of measuring one or more electrical properties.

Controller 275 may be connected to the electrical sensors 270, and may receive measurements from the electrical sensors 270. Controller 275 may be coupled to data store 280, which may correspond to data store 150 in embodiments. Controller 275 may determine target or threshold measurement values from data store 150, and may compare the measured electrical values received from electrical sensors 270 to the stored values. The stored values may be indicative of values that are achieved when a supported substrate makes full contact with the surface of the substrate-holder 250. If the measured values deviate from the stored values by more than a deviation threshold, then this may indicate that the substrate is bowed (and thus that a portion of the substrate is not in sufficient contact with the surface of the substrate-holder 250). Accordingly, controller 275 may adjust the power delivered to the electrodes 255 responsive to a determination that the measured values deviate from the target values by more than a threshold difference amount. The increased power or voltage can cause the electrodes to pull the substrate flat, ensuring full contact between the substrate and the surface of the substrate-holder. Such full contact facilitates proper heat transfer between the substrate-holder 250 and the substrate 202, and eliminates any gap between the substrate-holder 250 and the substrate 202 that might cause arcing, might cause a backside of the substrate that is exposed to be coated, and so on.

Figure 3:
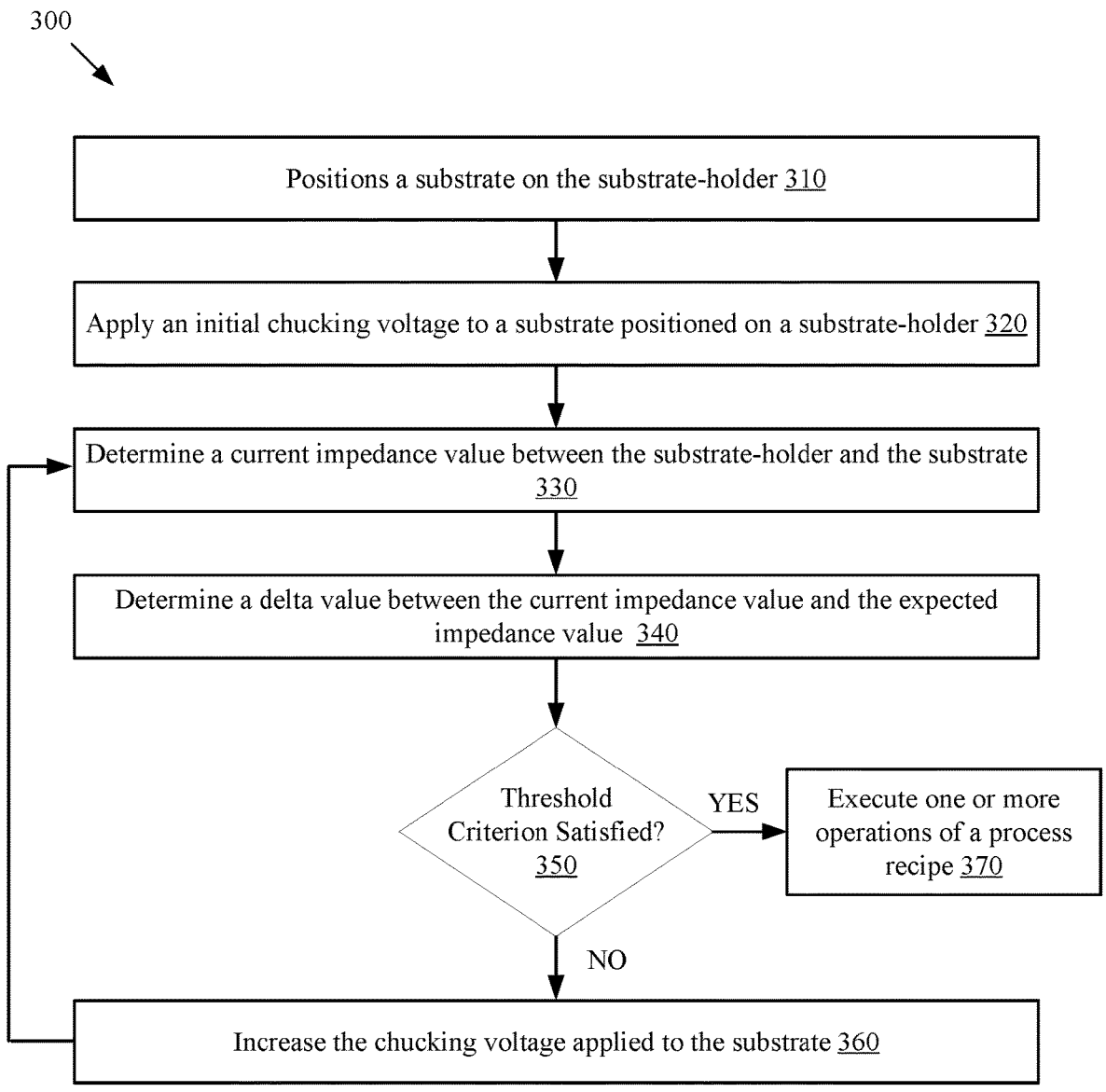
FIG. 3 is a flow chart of a method for a performing a chucking sequence on a substrate, according to certain embodiments.

FIG. 3 is a flow chart of a method 300 for performing a chucking sequence on a substrate, according to aspects of the present disclosure. Method 300 is performed by processing logic that can include hardware (circuitry, dedicated logic, etc.), software (such as is run on a general purpose computer system or a dedicated machine), firmware, or some combination thereof. In one implementation, method 300 can be performed by one or more components of manufacturing system 100 of FIG. 1 and/or processing chamber 200 of FIG. 2, such as system controller 128 and/or controller 275. In other or similar implementations, one or more operations of method 300 can be performed by one or more other machines not depicted in the figures, such as, for example, a client device.

At operation 310, processing logic positions a substrate on the substrate-holder. For example, the processing logic can be configured to command a transfer chamber robot (e.g., transfer chamber robot 112) to transfer a substrate (e.g., substrate 102) to a process chamber (e.g., process chamber 114, 116, 118) and position the substrate on the substrate-holder.

At operation 320, the processing logic applies an initial chucking voltage to a substrate positioned on a substrate-holder. In some embodiments, the initial chucking voltage can be set during calibration of the manufacturing system or process chamber. For example, the initial chucking voltage can be determined based on the minimum or average chucking voltage that is sufficient to chuck a substrate with no bow and/or warp. In some embodiments, the initial chucking voltage can be set by user input via a client device. In some embodiments, the initial chucking voltage can be determined using a chucking profile. In some embodiments, prior to positioning the substrate on the substrate-holder, the bow of the incoming substrate can be measured, and power of the DC source is adjusted accordingly to adjust the electrostatic chucking force sufficient to maintain contact with the substrate-holder having the determined amount of bow. The bow can be measured using one or more sensor of the manufacturing system 100 (e.g., using distance measurement sensors to determine the distance from the center of the substrate to one or more ends of the substrate) or via manual calculations by a user. Based on the determined bow, the processing logic can reference a data structure (a format having a set of data values, the relationships among them, and/or the functions or operations that can be applied to the data values), stored on a data store, to determine the corresponding initial chucking voltage. For example, different bow amounts may be associated with different initial chucking voltages. The higher the bow amount, the higher the initial chucking voltage to overcome the bow and pull the substrate flat against the substrate-holder. In some embodiments, once the substrate is received, the processing logic can wait a predetermined time period prior to performing operation 320.

At operation 330, the processing logic determines a current impedance value (or other measurement value) between the substrate-holder and the substrate. In some embodiments, the processing logic can determine the current impedance value (or other measurement value) by obtaining one or more measurements using one or more electrical sensors coupled to the substrate-holder. For example, the processing logic can obtain multiple impedance readings from different electrical sensors coupled to or embedded in the substrate-holder, and determine an average impedance value from the multiple impedance readings.

At operation 340, the processing logic determines a delta value between the current value (e.g., impedance value) and an expected or target value (e.g., impedance value). In one embodiment, the delta is determined by subtracting the expected value from the current value, and/or determining an absolute value of the difference between the two values. The expected value (e.g., impedance value) can be a value indicative of a chucked substrate experiencing no bow (or an acceptable minimum bow). In some embodiments, the expected value can be obtained from a data structure stored on a data store. The expected value can be determined based on, for example, experimental results conducted by one or more users.

At operation 350, the processing logic determines whether the delta value satisfies a chuck threshold criterion. In some embodiments, the chuck threshold criterion is a predetermined threshold value. For example, the processing logic can determine whether the delta value is below than a predetermined threshold value. Responsive to the delta value satisfying the chuck threshold value (e.g., being lower than the predetermined threshold value, thus indicating that the substrate is chucked), the processing logic proceeds to operation 370, where the processing logic can perform one or more operations of a process recipe. Responsive to the delta value failing to satisfy the predetermined threshold value (e.g., being greater than the predetermined threshold value), the processing logic proceeds to operation 360.

At operation 360, the processing logic can increase the chucking voltage applied to the substrate. In some embodiments, the processing logic can increase the chucking voltage by a predetermined increment. For example, the processing logic can increase the chucking voltage by 10V. In some embodiments, responsive to increasing the chucking voltage, the processing logic can wait a predetermined amount of time prior to proceeding to the next operation. This delay can allow for the electro-static force to affect the substrate. The processing logic then proceeds to operation 330 and determines a new value (e.g., new impedance value) between the substrate-holder and the substrate. The new value can then be compared to the expected value, to again determine whether the substrate is properly chucked. If not, the method may again return to block 330 after again increasing the chucking voltage. This process may continue until the substrate is fully chucked.

Once the substrate is properly chucked (i.e., the bow of the substrate has been effectively eliminated and/or the threshold criterion has been satisfied), the method proceeds to operation 370 and a manufacturing process is performed.

In some embodiments, during the manufacturing process, the manufacturing system can take periodic readings (e.g., periodic impedance readings). After each such reading, the measured value (e.g., impedance value) may be compared to the expected value, and an absolute of the difference between the two values may be compared to the threshold criterion. The manufacturing process may have caused the substrate to bow (or to bow further than it was initially bowed), which can cause the substrate to no longer be properly chucked. Accordingly, responsive to determining that bowing has occurred (e.g., a delta value is greater than the chuck threshold value), the manufacturing system can increase the chucking voltage until a new delta value has satisfied the threshold criterion. Accordingly, the operations of blocks 330-370 may be performed periodically or continuously during a manufacturing process in addition to or instead of before the manufacturing process begins.

In some embodiments, the processing logic can generate and/or update a chucking profile. For example, the chucking profile could be associated with the particular process recipe used on the chucked substrate. The processing logic can update the chucking profile to include the chucking voltage used to chuck the substrate prior to the execution of the process recipe, and correlate each chucking voltage increase (or set of chucking voltage increases) to each corresponding process recipe step. Accordingly, during subsequent manufacturing processes using the particular process recipe, the processing logic can use the chucking profile to set the initial chucking voltage and perform chucking voltage increases during specified steps of the process recipe.

FIG. 4 is a flow chart of a method 400 for performing a de-chucking sequence on a substrate, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by one or more components of manufacturing system 100 of FIG. 1 and/or processing chamber 200 of FIG. 2, such as system controller 128 and/or controller 275. In other or similar implementations, one or more operations of method 400 can be performed by one or more other machines not depicted in the figures, such as, for example, a client device.

At operation 410, the processing logic applies a chucking voltage to a substrate chucked to a substrate-holder. In some embodiments, the chucking voltage can be the same as the last applied chucking voltage during a manufacturing process. In some embodiments, the chucking voltage can be the maximum chucking voltage capable of being applied by the substrate-holder. In some embodiments, the chucking voltage can be a user-defined voltage, a predetermined voltage, or a voltage obtained from a de-chucking profile. In some embodiments, prior to performing operation 410, the processing logic can wait a predetermined time period after the completion of the manufacturing process on the substrate. In some embodiments, the processing logic can perform one or more de-chucking procedure prior to performing operation 410, such as flushing the process chamber with an inert gas.

At operation 420, the processing logic determines a current impedance value (or other measurement value) between the substrate-holder and the substrate. In some embodiments, the processing logic can determine the current impedance value (or other measurement value) by obtaining one or more measurements using one or more electrical sensors coupled to the substrate-holder. For example, the processing logic can obtain multiple impedance readings from different electrical sensors coupled to or embedded in the substrate-holder, and determine an average impedance value from the multiple impedance readings.

At operation 430, the processing logic determines a delta value between the current value (e.g., impedance value) and an expected or target value (e.g., impedance value). In one embodiment, the delta is determined by subtracting the expected value from the current value, and/or determining an absolute value of the difference between the two values. The expected value (e.g., impedance value) can be a value indicative of the electrostatic force being dissipated or not strong enough to cause damage to the substrate during its removal. In some embodiments, the expected value can be obtained from a data structure stored on a data store. The expected value can be determined based on, for example, experimental results conducted by one or more users.

At operation 440, the processing logic determines whether the delta value satisfies a de-chuck threshold criterion. In some embodiments, the de-chuck threshold criterion is a threshold value. For example, the processing logic can determine whether the delta value is greater than a predetermined threshold value. Responsive to the delta value satisfying the de-chuck threshold value (e.g., being greater than the predetermined threshold value, thus indicating that the substrate is de-chucked), the processing logic proceeds to operation 460, where the processing logic can indicate, to the manufacturing system, that the substrate is de-chucked. Responsive to the delta value failing to satisfy the predetermined threshold value (e.g., being less than the predetermined threshold value), the processing logic proceeds to operation 450. In some embodiments, the de-chuck threshold criterion is similar to or the same as the chuck threshold criterion. In other embodiments, the de-chuck threshold criterion is a value independent of the chuck the chuck threshold criterion.

At operation 450, the processing logic decreases the chucking voltage applied to the substrate. In some embodiments, the processing logic can decrease the chucking voltage by a predetermined increment. For example, the processing logic can decrease the chucking voltage by 10V. In some embodiments, responsive to deincreasing the chucking voltage, the processing logic can wait a predetermined amount of time prior to proceeding to the next operation. This delay can allow for the electro-static force to dissipate from the substrate and/or substrate-holder. The processing logic then proceeds to operation 420 and determines a new value (e.g., new impedance value) between the substrate-holder and the substrate. The new value can then be compared to the expected value, to again determine whether the substrate is de-chucked. If not, the method may again return to block 420 after again decreasing the chucking voltage. This process may continue until the substrate is de-chucked.

Once the substrate is properly de-chucked, the method proceeds to operation 460 and a transfer chamber robot (e.g., transfer chamber robot 112) can remove the substrate from the substrate-holder.

In some embodiments, the processing logic can generate and/or update a de-chucking profile. For example, the processing logic can update the de-chucking profile to include the de-chucking voltage where the substrate become de-chucked. Accordingly, during subsequent manufacturing processes, the processing logic can use the chucking profile to set the initial chucking voltage during a de-chucking operation.

Figure 5:
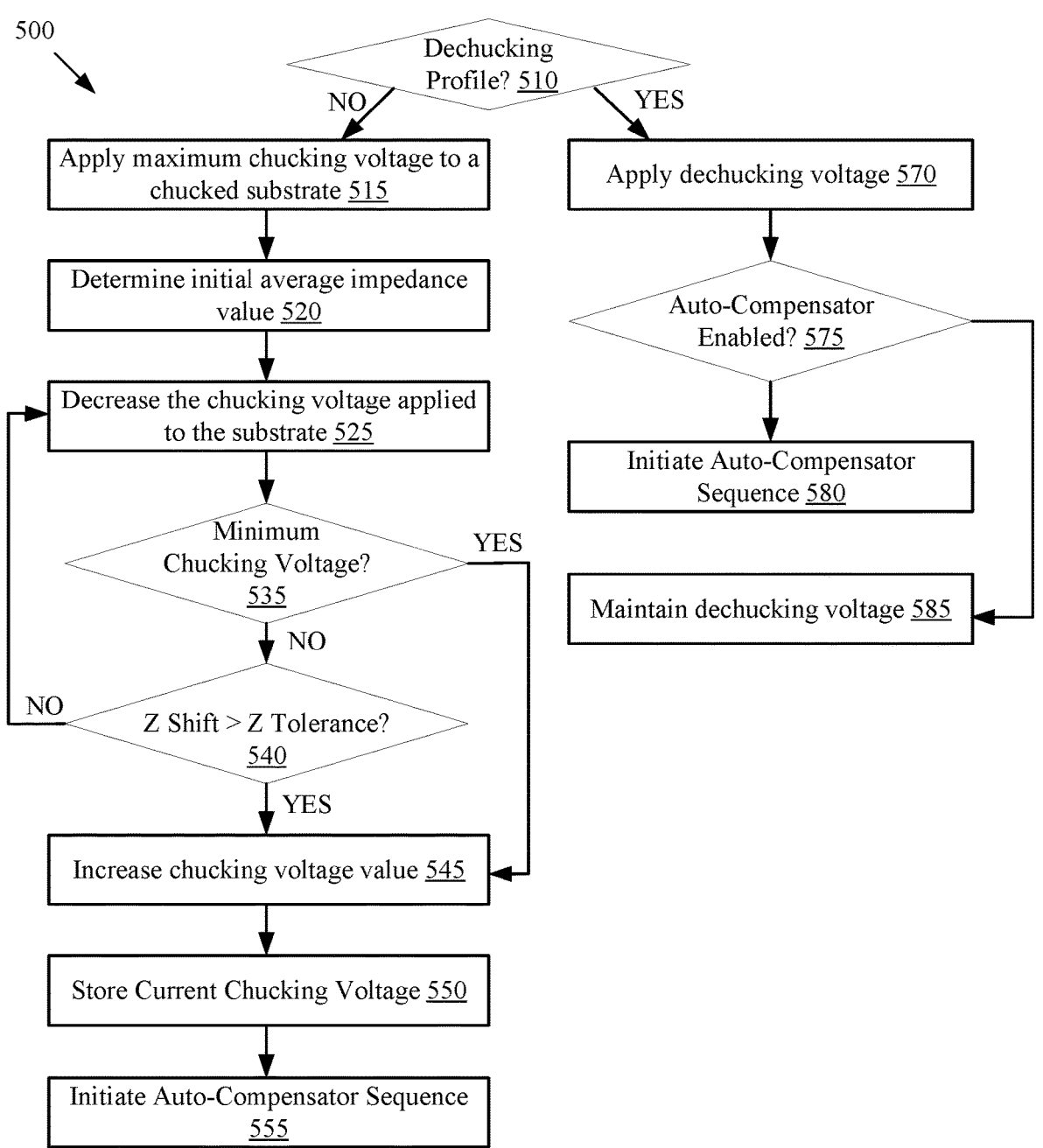
FIG. 5 is a flow chart of a method for method for determining a de-chucking profile during a manufacturing process on a substrate, according to certain embodiments.

FIG. 5 is a flow chart of a method 500 for determining a de-chucking profile during a manufacturing process on a substrate, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by one or more components of manufacturing system 100 of FIG. 1 and/or processing chamber 200 of FIG. 2, such as system controller 128 and/or controller 275. In other or similar implementations, one or more operations of method 500 can be performed by one or more other machines not depicted in the figures, such as, for example, a client device. Method 500 can be initiated in response to user input or automatically (e.g., according to a step of a recipe, in response to the completion of a manufacturing process, etc.).

Method 500 can be performed while a manufacturing process is performed on a substrate.

At operation 510, the processing logic determines whether the manufacturing system include a de-chucking profile for the executed process recipe. For example, the processing logic can query the data store for any corresponding de-chucking profiles. Responsive to determining that the manufacturing system includes a corresponding de-chucking profile, the processing logic proceeds to operation 570. Responsive to determining that the manufacturing system does not include a corresponding de-chucking profile, the processing logic proceeds to operation 515.

At operation 515, the processing logic applies a maximum chucking voltage to the substrate chucked to the substrate-holder. The maximum chucking voltage can be a maximum voltage value that the substrate-holder can apply to the coupled electrodes.

At operation 520, the processing logic determines a current impedance value (or other measurement value) between the substrate-holder and the substrate. In some embodiments, the processing logic can determine the current impedance value (or other measurement value) by obtaining one or more measurements using one or more electrical sensors coupled to the substrate-holder. For example, the processing logic can obtain multiple impedance readings from different electrical sensors coupled to or embedded in the substrate-holder, and determine an average impedance value from the multiple impedance readings. In some embodiments, the processing logic can determine the current impedance value by obtaining the one or more measurements over a predetermined period of time (e.g., a monitoring time).

At operation 525, the processing logic decreases the chucking voltage applied to the substrate. In some embodiments, the processing logic can decrease the chucking voltage by a predetermined increment (e.g., 10V). In some embodiments, responsive to increasing the chucking voltage, the processing logic can wait a predetermined amount of time prior to proceeding to the next operation to allow for the electro-static force to dissipate from the substrate and/or substrate-holder.

At operation 530, the processing logic determines whether the chucking voltage reached a minimum chucking voltage. The minimum chucking voltage can be the minimum voltage required to chuck a substrate to a substrate holder. Responsive to determining that the chucking voltage reached the minimum chucking voltage, the processing logic proceeds to operation 545. Responsive to determining that the chucking voltage did not reached the minimum chucking voltage, the processing logic proceeds to operation 540.

At operation 540, the processing logic determines whether the impedance change is greater than a threshold value. In particular, the processing logic can first determines a delta value between the current impedance value and an expected or target impedance value. In one embodiment, the delta is determined by subtracting the expected value from the current value, and/or determining an absolute value of the difference between the two values. The expected value can be a value indicative of a chucked substrate experiencing no bow (or an acceptable minimum bow). In some embodiments, the expected value can be obtained from a data structure stored on a data store. The expected value can be determined based on, for example, experimental results conducted by one or more users. The processing logic can then determine whether the delta value satisfies a chuck threshold criterion. In some embodiments, the chuck threshold criterion is a predetermined threshold value. For example, the processing logic can determine whether the delta value is below than a predetermined threshold value. Responsive to the delta value satisfying the chuck threshold value (e.g., being lower than the predetermined threshold value, thus indicating that the substrate is chucked), the processing logic proceeds to operation 525, decrease the chucking voltage applied to the substrate. Responsive to the delta value failing to satisfy the predetermined threshold value (e.g., being greater than the predetermined threshold value, thus indicating that the substrate is de-chucking), the processing logic proceeds to operation 545.

At operation 545, the processing logic increase the chucking voltage to chuck the substrate. In some embodiments, the processing logic can increase the chucking voltage by the predetermined increment used in operation 525 (e.g., 10V), or by any other predetermined increment.

At operation 550, the processing logic can store, in a metadata table, the voltage value reflecting the delta value failing to satisfy the predetermined threshold value. In particular, the processing logic can store the voltage value where the substrate was not chucked (e.g., the voltage value prior to the operation 545). In some embodiments, the processing logic can generate a de-chucking profile for the current process recipe based on this voltage value.

At operation 555, the processing logic initiates an auto-compensator chucking sequence to automatically keep the substrate chucked on the substrate-holder. For example, the processing logic can initiate method 300.

Returning to operation 510, responsive to determining that the manufacturing system includes a corresponding de-chucking profile, the processing logic proceeds to operation 570. At operation 570, the processing logic applies a de-chucking voltage obtained from the de-chucking profile.

At operation 575, the processing logic determines whether an auto-compensator chucking sequence is enabled. Responsive to determining that the auto-compensator chucking sequence is enabled, the processing logic proceeds to operation 580, and initiates the auto-compensator chucking sequence to automatically keep the substrate chucked on the substrate-holder. Responsive to determining that the auto-compensator chucking sequence is not enabled, the processing logic proceeds to operation 585, and maintains the current chucking voltage.

Figure 6:
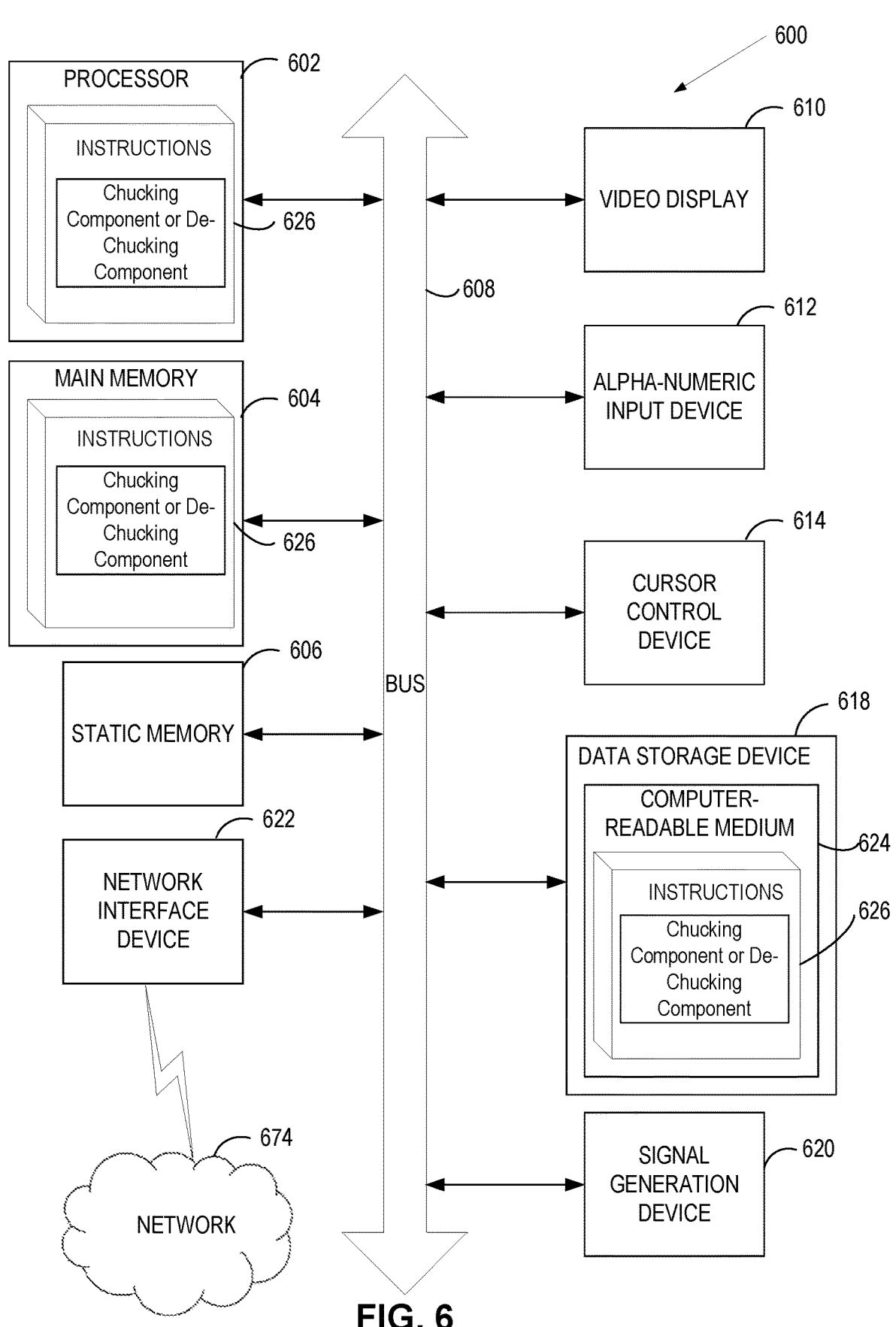
FIG. 6 is a block diagram illustrating a computer system, according to certain embodiments.

FIG. 6 is a block diagram illustrating a computer system 600, according to certain embodiments. In some embodiments, computer system 600 can be connected (e.g., via a network, such as a Local Area Network (LAN), an intranet, an extranet, or the Internet) to other computer systems. Computer system 600 can operate in the capacity of a server or a client computer in a client-server environment, or as a peer computer in a peer-to-peer or distributed network environment. Computer system 600 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 can include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which can communicate with each other via a bus 608.

Processing device 602 can be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 can further include a network interface device 622 (e.g., coupled to network 674). Computer system 600 also can include a video display unit 610 (e.g., an LCD), an alphanumeric input device 612 (e.g., a keyboard), a cursor control device 614 (e.g., a mouse), and a signal generation device 620.

In some implementations, data storage device 616 can include a non-transitory computer-readable storage medium 624 on which can store instructions 626 encoding any one or more of the methods or functions described herein, including instructions encoding components of FIG. 1 (e.g., a chucking module (not shown) of the system controller 128), a de-chucking module (not shown) of system controller 128, etc.) and for implementing methods described herein. In some embodiments, the chucking module can perform the operations of method 300. In some embodiments, the de-chucking module can perform the operations of method 400.

Instructions 626 can also reside, completely or partially, within volatile memory 604 and/or within processing device 602 during execution thereof by computer system 600, hence, volatile memory 604 and processing device 602 can also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and can not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:

applying, to an electrode of a substrate-holder, a first voltage;

determining a first impedance value between the substrate-holder and the substrate, wherein the first impedance value comprises an average impedance determined from a plurality of measurements using one or more electrical sensors coupled to the substrate-holder;

determining a delta value between the first impedance value and a predetermined second impedance value;

determining whether the delta value satisfies a de-chuck threshold criterion; and responsive to the delta value failing to satisfy the de-chuck threshold criterion, applying a second voltage to the substrate, wherein the second voltage is lower than the first voltage.

2. The method of claim 1, wherein the first voltage reflects an electrostatic chucking force sufficient for the substrate to maintain contact with the substrate-holder.

3. The method of claim 1, wherein the predetermined second impedance value comprises an impedance value indicative of a substrate that is de-chucked.

4. The method of claim 1, wherein the second voltage comprises a difference between the first voltage and a decremental voltage value.

5. The method of claim 1, further comprising:

responsive to the delta value satisfying the threshold criterion, updating a de-chucking profile based on the second voltage.

6. An electronic device manufacturing system, comprising:

a substrate-holder configured to secure a substrate during processing; and a controller, operatively coupled to the substrate-holder, the controller to:

applying, to an electrode of the substrate-holder, a first voltage;

determining a first impedance value between the substrate-holder and the substrate, wherein the first impedance value comprises an average impedance determined from a plurality of measurements using one or more electrical sensors coupled to the substrate-holder;

determining a delta value between the first impedance value and a predetermined second impedance value;

determining whether the delta value satisfies a de-chuck threshold criterion; and responsive to the delta value failing to satisfy the de-chuck threshold criterion, applying a second voltage to the substrate, wherein the second voltage is lower than the first voltage.

7. The electronic device manufacturing system of claim 6, wherein the first voltage reflects an electrostatic chucking force sufficient for the substrate to maintain contact with the substrate-holder.

8. The electronic device manufacturing system of claim 6, wherein the second impedance value comprises an impedance value indicative of a substrate is de-chucked.

9. The electronic device manufacturing system of claim 6, wherein the second voltage comprises a difference between the first voltage and a decremental voltage value.

10. The electronic device manufacturing system of claim 6, responsive to the delta value satisfying the threshold criterion, updating a de-chucking profile based on the second voltage.

11. A non-transitory computer-readable storage medium comprising instructions that, when executed by a processing device operatively coupled to a memory, performs operations comprising:

applying, to an electrode of a substrate-holder, a first voltage;

determining a first impedance value between the substrate-holder and the substrate, wherein the first impedance value comprises an average impedance determined from a plurality of measurements using one or more electrical sensors coupled to the substrate-holder;

determining a delta value between the first impedance value and a predetermined second impedance value;

determining whether the delta value satisfies a de-chuck threshold criterion; and responsive to the delta value failing to satisfy the de-chuck threshold criterion, applying a second voltage to the substrate, wherein the second voltage is lower than the first voltage.

12. The non-transitory computer-readable storage medium of claim 11, wherein the first voltage reflects an electrostatic chucking force sufficient for the substrate to maintain contact with the substrate-holder.

13. The non-transitory computer-readable storage medium of claim 11, wherein the second impedance value comprises an impedance value indicative of a substrate is de-chucked.

14. The non-transitory computer-readable storage medium of claim 11, responsive to the delta value satisfying the threshold criterion, updating a de-chucking profile based on the second voltage.

*    *    *    *    *